United States Patent [19]

Wilson et al.

[11] Patent Number: 4,728,844
[45] Date of Patent: Mar. 1, 1988

[54] PIEZOELECTRIC TRANSDUCER AND COMPONENTS THEREFOR

[75] Inventors: Paul Wilson, Berkshire; Peter Kent, Buckinghamshire; Duncan Stewart; Robert Crocker, both of Berkshire, all of United Kingdom

[73] Assignee: Cogent Limited, London, England

[21] Appl. No.: 890,331

[22] Filed: Jul. 29, 1986

Related U.S. Application Data

[63] Continuation-in-part of Ser. No. 843,672, Mar. 25, 1986.

[51] Int. Cl.⁴ .............................................. H01L 41/08
[52] U.S. Cl. .................................... 310/327; 310/366; 310/800
[58] Field of Search ................. 310/327, 800, 334–337; 73/632, 642, 644, 861.18, 861.23

[56] References Cited

U.S. PATENT DOCUMENTS

| | | | |
|---|---|---|---|
| 2,707,755 | 5/1955 | Hardie et al. | 310/327 X |
| 3,189,767 | 6/1965 | Goldman et al. | 310/327 |
| 3,546,012 | 12/1970 | Dixon et al. | 310/327 X |
| 3,789,656 | 2/1974 | Miller | 310/327 UX |
| 4,240,004 | 12/1980 | Coleman | 310/327 |
| 4,297,607 | 10/1981 | Lynnworth et al. | 310/327 X |
| 4,373,401 | 2/1983 | Baumoel | 310/334 X |
| 4,381,470 | 4/1983 | Leach et al. | 310/327 |
| 4,430,593 | 2/1984 | Gohlert et al. | 310/327 |
| 4,523,122 | 6/1985 | Tone et al. | 310/334 |
| 4,528,652 | 7/1985 | Horner et al. | 310/327 X |
| 4,571,520 | 2/1986 | Saito et al. | 310/327 |

*Primary Examiner*—Mark O. Budd
*Attorney, Agent, or Firm*—Larson and Taylor

[57] ABSTRACT

A piezoelectric transducer comprising a casing having an opening in one face and a piezoelectric element extending across the opening has a casing containing a backing material in direct contact with the piezoelectric element. The backing material comprises a polymeric composition which may contain a heavy metal oxide, e.g. BiO, or a metal, e.g. Ni, in particulate form, and/or may contain particles of a material of lower specific gravity than the surrounding composition, the distribution of said particles being such that they are most concentrated in a region remote from the piezoelectric element and are least concentrated or essentially absent in the region immediately adjacent the piezoelectric element.

5 Claims, 7 Drawing Figures

PIEZOELECTRIC TRANSDUCER AND COMPONENTS THEREFOR

This application is a continuation-in-part of copending Ser. No. 843,672, filed Mar. 25, 1986.

This invention relates to piezoelectric transducers and their construction.

Piezoelectric transducers commonly employ a ceramic piezoelectric element having electrodes on its oppositely polarised surfaces. A change of stress in the piezoelectric element produces a temporary potential difference across the electrodes, and conversely a change in potential difference across the electrodes induces a temporary change in stress within the element. More recently it has been discovered that a piezoelectric element can be made from plastics material, especially polyvinylidene fluoride (PVdF). This has different piezoelectric characteristics from ceramic elements, and has useful physical properties which make it easier and cheaper to fashion piezoelectric devices, especially high frequency devices, for example because the plastics material can easily be prepared as a thin film, whereas it is very difficult to prepare and handle a correspondingly thin layer of ceramic material.

In a thin layer piezoelectric device, the piezoelectric layer is polarised across the thickness of the layer, and electrodes are formed by depositing conductive layers, for example of metallised film, on opposite surfaces of the piezoelectric layer. Where an area of electrode on one surface lies directly opposite an area of electrode on the opposite surface (in the specification we will use the term "overlaps") there is produced the active piezoelectric transducer region of the device. The electrode areas can be readily shaped, for example by selective deposition of metallised film, or by selectively etching away portions of a deposited film. In this way piezoelectric transducers with specifically desired properties can be produced, especially for example for use as ultrasonic transducers capable of transmitting a focussed or shaped ultrasound signal. An additional advantage of using selectve deposition of metallised film is that when an electric field is applied to pole the film or cause it to become electroactive, it is possible to restrict the activity to defined areas.

The wanted signal is produced in and transmitted from the active piezoelectric region, and portions of an electrode which project beyond the region (i.e., do not overlap part of an opposite electrode) do not produce any appreciable piezoelectric signal, and are therefore often provided for attaching electrical conductors to the electrodes. Without these non-active regions of the electrode used for making electrical contact, undesirable signals can be generated and provide an unwanted background "noise" which interferes with the signal produced or detected by the piezoelectric active region.

If these non-active connector regions are bent out of the plane of the piezoelectric layer, it has been found that they are very liable to fail in a relatively short time, and so the life of the device is reduced.

The present invention provides an improved design of piezoelectric transducer component and transducers incoporating such components.

According to one aspect of the present invention there is provided a piezoelectric transducer comprising a casing having an opening in one face and a piezoelectric element extending across the opening, the casing containing a backing material in direct contact with the piezoelectric element, the backing material comprising a polymeric composition containing a heavy metal oxide in particulate form. Preferably, the heavy metal oxide is bismuth oxide.

In a second aspect of the present invention there is provided a piezoelectric transducer comprising a casing having an opening in one face and a piezoelectric element extending across the opening, the casing containing a backing material in direct contact with the piezoelectric element, the backing material comprising a polymeric composition containing a metal in particulate form.

Preferably, the particulate metal comprises nickel.

According to a third aspect of the present invention there is provided a piezoelectric transducer comprising a casing having an opening in one face and a piezoelectric element extending across the opening, the casing containing a backing material in direct contact with the piezoelectric element, the backing material comprising a polymeric composition containing particles of a material of lower specific gravity than the surrounding composition, the distribution of said particles being such that they are most concentrated in a region remote from the piezoelectric element and are least concentrated or essentially absent in the region immediately adjacent the piezoelectric element.

Preferably, the particles comprise PVdF or a PVdF/TrFE copolymer, and it is also desirable that the polymeric composition contains also bismuth oxide and nickel in particulate form.

In order that the invention may be more clearly understood, various embodiments will now be described with reference to the accompanying drawings, wherein.

Figure 1:
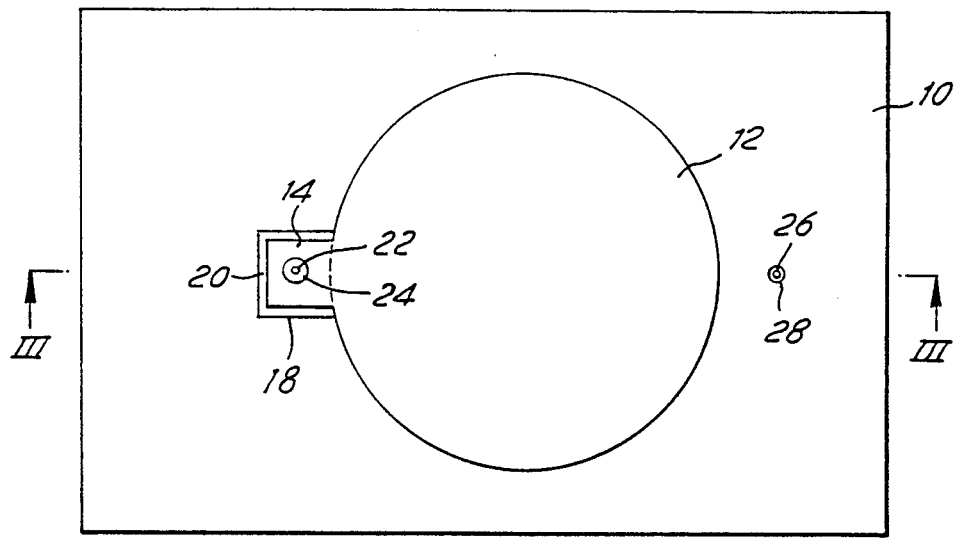
FIG. 1 shows a view on one surface of a transducer component.
Figure 2:
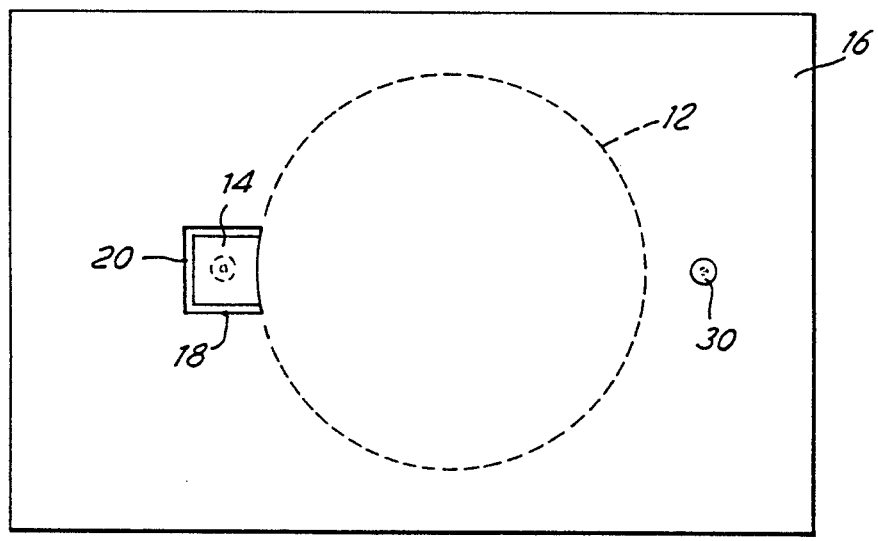
FIG. 2 shows a view on the opposite surface of the transducer component.
Figure 3:
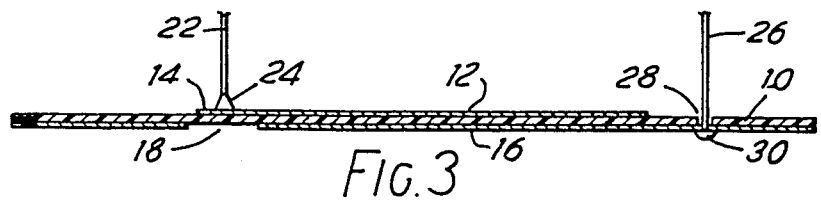
FIG. 3 shows a cross-section through the component along the line III—III of FIG. 1, with the thickness of the layers greatly exaggerated for clarity.

Referring to the drawings and firstly to FIGS. 1 to 3; the transducer component comprises a PVdF film 10 which has been treated in known manner to make it piezoelectric. On one surface of the film is applied a conductive layer 12, for example of gold, suitably applied by known vapour deposition techniques. The conductive layer 12 takes the form of a disc, and has a small rectangular extension 14 to one side.

As shown in FIG. 2, the other surface of the layer 10 is completely coated with a metallised layer 16, except for a generally rectangular window 18 which is coincident with the extension 14 on the other surface, but slightly (about 0.5 mm) larger on the sides remote from the disc 12, thereby creating a narrow gap 20 where there is no metallised layer on either surface. Thus, the piezoelectrically active region, defined between two overlapping metallised areas, is the region defined by the disc 12, since all other parts of the film 16 have a conductive layer on one side only or on neither side.

An electrical connection is made to the metallised layer 12 in conventional manner by adhering an electrical lead 22 to the extension region 14 using for example conductive epoxy resin 24 or solder. An electrical connection is made with the other metallised surface 16 by making a hole 28 through the film outside the active region, passing an electrical lead 26 through the hole and adhering it to the conductive layer 16 by conductive epoxy resin 30 or solder. Thus, the electrical leads 22,26 extend in the same direction from the surface of the film 10 which carries a smaller conductive area 12,14.

Figure 7:
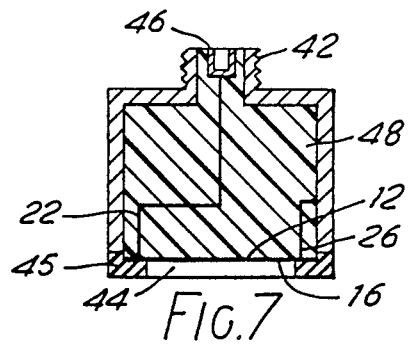
FIG. 7 shows a cross-sectional side view through a transducer incorporating for example a piezoelectric component of FIGS. 1 to 3.

The manner in which such a transducer can be used is illustrated in FIG. 7. A casing 40 is made from metal, and is provided at one end with for example an externally screw-threaded boss 42 for connection to a suitable support, and at the opposite end with an opening 44, in this case circular and of the same size as the disc 12. The film 10 is cut to an appropriate size around the inactive region outside the disc 10 so that it will fit inside the casing 40 over the opening 44 so as to be supported peripherally by the casing around the opening. Whereas the casing as a whole is made of metal, this peripheral region 45 around the opening can suitably be made of synthetic resin such as epoxy material. The transducer component is peripherally secured in place with the larger conductive surface 16 facing outwardly of the casing and the smaller conductive disc 12 on the inside of the casing in register with the opening 44. Thus, the electrical leads 22,26 also lie inside the casing. The lead from the external conductive surface 16 is connected to the metal casing 40, while the lead 22 from the conductive disc 12 is taken to a terminal 46 in the boss 42 insulated from the casing 40; the interior of the casing being then filled with an electrically insulating material 48 such as an epoxy resin.

A preferred material 48 is a filled resin, wherein the filler comprises bismuth oxide or PVdF granules, preferably both, and most preferably also nickel powder. In a typical composition, 100 parts by weight of Araldite (Ciba-Geigy trade mark) CY1301 epoxy resin, 30 parts HY1300 hardener, 180 parts BiO and 60 parts Ni are mixed and poured into the transducer casing through the top 42. PVdF granules, typically 1.5×3 mm, are then added to the resin in the casing so as to form a virtually continuous layer at the top (remote from the piezoelectric element) with the density of granule concentration decreasing downwards so that there are virtually no granules close to the piezoelectric element. The resin is then allowed to harden.

The resulting transducer has a number of significant properties arising from the nature of the backing material 48. To begin with, there is no separate bonding material between the piezoelectric element and the backing, as there is with conventional piezoelectric devices, and this eliminates one source of unwanted signal. Then, the PVdF granules reduce the signal loss due to reflection from the top face of the resin, while the Ni and BiO particles scatter the reflected signals, while at the same time provide sufficient density to the resin to prevent the PVdF granules from sinking to the bottom (near the piezoelectric element).

Granules other than PVdF could be used, but it is convenient to use the same material as that used to make the piezoelectric layer, and PVdF has suitable properties for reducing stray reflected signals. The graded distribution of the granules through the depth of the epoxy resin is useful in randomizing the reflections of the unwanted signals.

Nickel is convenient as a filler for scattering the unwanted reflections and increasing the density of the resin composition. However, too much nickel would make the resin conductive, and since there is no insulating adhesive layer between the resin backing and the piezoelectric element, this would be obviously detrimental. BiO is insulating and dense, and provides likewise good acoustic properties for scattering the unwanted signal.

The amounts and relative proportions of BiO, Ni and resin are not critical, and can generally be varied within about 10% of the figures given above without significant effect in performance.

All three materials, BiO, Ni and PVdF granules have a high acoustic mismatch with epoxy resin, which aids the acoustic scattering effect and minimises unwanted signals from the back of the transducer. The particulate materials can be used separately or in combinations of two of them, but optimum performance is obtained by the use of all three particulate materials.

Figure 6:
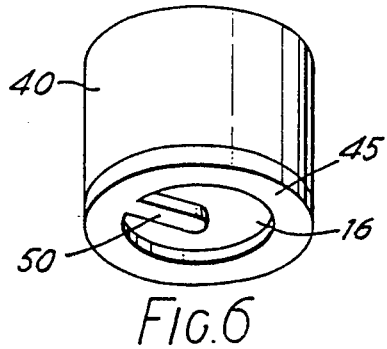
FIG. 6 shows a perspective view of a transducer incorporating the component of FIG. 5.

In the construction shown in FIG. 6, there is only one region from which substantial background noise might be produced; namely the extension 14 of the inner conductive layer 12, and this is closely surrounded by the outer conductive surface 16 which is connected to the casing and acts as a screen, thereby limiting the amount of electrical noise emission from the area 14. Typically the area 14 may be about 2 to 3 mm square.

The transducer can be used for example to emit an ultrasound signal and pick up any returning echo. Such devices are useful in ultrasound scanners in medical diagnosis, and in non-destructive testing of materials.

Many variations are possible on the size, shape and configuration of the piezoelectrically active region, and the type of transducer device into which the piezoelectric element is incorporated. The present invention is particularly suitable for the production of multi-element transducer components, examples of which are shown in FIGS. 4 to 6.

Figure 4:
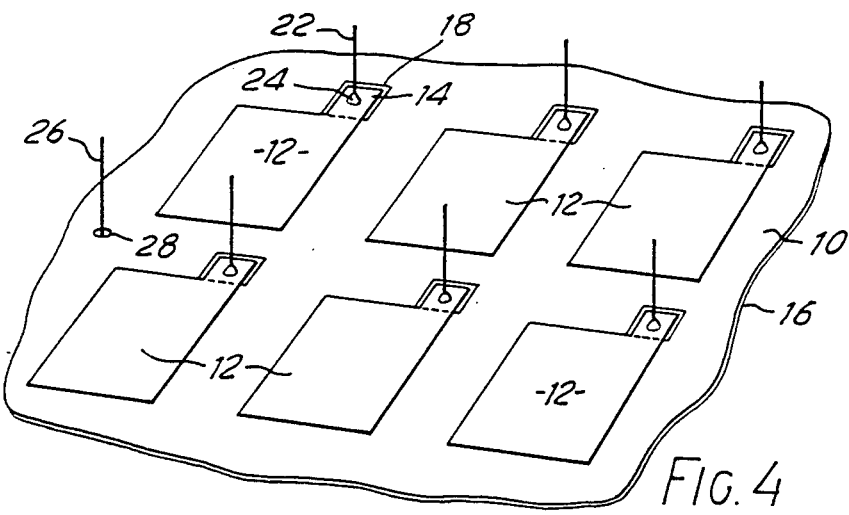
FIG. 4 shows a perspective view of another embodiment of piezoelectric component.

In FIG. 4, a single piezoelectric film 10 is provided with a single conductive layer 16 on one side and a series of smaller conductive layers 12 on the other side. Each conductive layer 12 has an extension 14 lying over a window 18 in the conductive layer 16, and has a respective lead 22 connected to the extension 14. Thus, an array of transducer elements is provided, and if they are intended to be used in that form, then a single electrical connection 26 can be made to the conductive layer 16. However, the construction of FIG. 4 may be used to produce individual separate transducer components by cutting the sheet between the elements, in which case separate connections 26 will have to be provided for each element. The active regions in the embodiment shown in FIG. 4 are shown as being rectangular, but they could be any desired shape or mixture of shapes.

Figure 5:
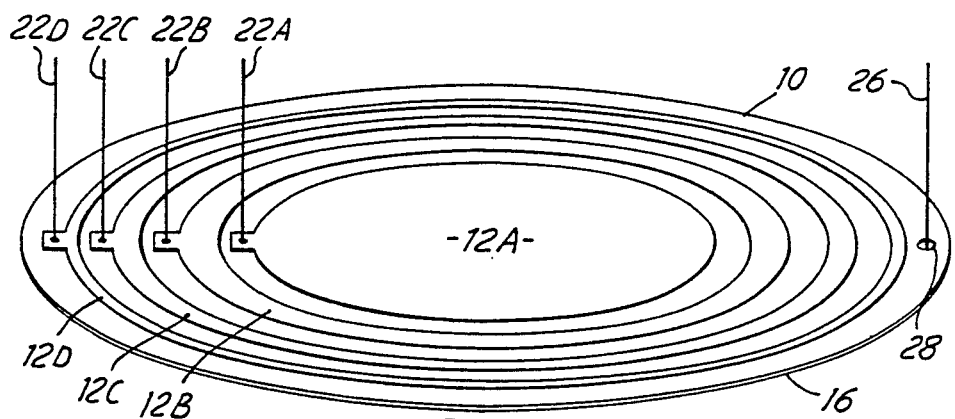
FIG. 5 shows a perspective view of a third embodiment of piezoelectric component.

FIG. 5 shows an embodiment in which the smaller conductive surfaces are provided on one side of the piezoelectric film 10 in the form of a central disc 12A (or it could be a ring) surrounded by a series of concentric rings 12B, C, D... etc. Each conductive surface 12 is provided with a respective electrical connector 22A to 22D etc. from respective extension elements lying over respective windows in the single conductive layer 16 provided on the other surface of the film 10. The conductive areas 12A to 12D etc. are designed so as to have the same area, and thus their width decreases as their diameter increases.

The device as shown in FIG. 5 can be incorporated in a transducer illustrated in FIG. 6, of analogous construction to that shown in FIG. 7, except of course that the electrical leads 22A to 22D will be taken to separate terminals insulated from the casing 40. Also, the windows 18 will obviously extend radially over the surface 16, and if desired these can be covered by an extension limb 50 of the epoxy rim 45 of the casing.

What is claimed is:

1. A piezoelectric transducer comprising a casing having an opening in one face and a piezoelectric element of a piezoelectric plastics material extending across the opening, the casing containing a backing material in direct contact with the piezoelectric element, the backing material comprising a polymeric composition containing particles of a material of lower specific gravity than the surrounding composition, the distribution of said particles being such that they are most concentrated in a region remote from the piezoelectric element and are least concentrated or essentially absent in the region immediately adjacent the piezoelectric element.

2. A piezoelectric transducer according to claim 1 wherein said particles comprise PVdF or a PVdF/TrFE copolymer.

3. A piezoelectric transducer according to claim 2 wherein the polymeric composition contains also bismuth oxide and nickel in particulate form.

4. A piezoelectric transducer comprising a casing having an opening in one face and a piezoelectric element of a piezoelectric plastics material extending across the opening, the casing containing a backing material in direct contact with the piezoelectric element, the backing material comprising a polymeric composition containing bismuth oxide in particulate form.

5. A piezoelectric transducer comprising a casing having an opening in one face and a piezoelectric element of a piezoelectric plastics material extending across the opening, the casing containing a backing material in direct contact with the piezoelectric element, the backing material comprising a polymeric composition containing nickel and bismuth oxide, each in particulate form.

* * * * *